(12) United States Patent
Stevens et al.

(10) Patent No.: US 6,375,746 B1
(45) Date of Patent: Apr. 23, 2002

(54) WAFER PROCESSING ARCHITECTURE INCLUDING LOAD LOCKS

(75) Inventors: Craig Stevens, Ben Lomond; Tony Jakubiec, San Jose, both of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/409,841

(22) Filed: Sep. 30, 1999

Related U.S. Application Data

(63) Continuation-in-part of application No. 09/346,258, filed on Jun. 30, 1999.
(60) Provisional application No. 60/092,242, filed on Jul. 10, 1998.

(51) Int. Cl.[7] .............................................. H01L 21/00
(52) U.S. Cl. ........................ 118/719; 118/724; 156/345
(58) Field of Search ................................ 118/719, 724, 118/728; 204/298.25, 298.35; 156/345; 414/217, 222.01, 222.07

(56) References Cited

U.S. PATENT DOCUMENTS

| | | | |
|---|---|---|---|
| 5,135,608 A | * | 8/1992 | Okutani ..................... 438/584 |
| 5,186,594 A | | 2/1993 | Toshima et al. ............. 414/217 |
| 5,314,541 A | * | 5/1994 | Saito et al. .................. 118/725 |
| 5,512,320 A | | 4/1996 | Turner et al. ............... 427/255 |
| 5,855,681 A | | 1/1999 | Maydan et al. ............. 118/719 |
| 5,882,165 A | | 3/1999 | Maydan et al. ............. 414/217 |
| 5,951,770 A | * | 9/1999 | Perlov et al. ............... 118/719 |
| 6,048,154 A | * | 4/2000 | Wytman ..................... 414/217 |

FOREIGN PATENT DOCUMENTS

| | | |
|---|---|---|
| EP | 0834907 A2 | 4/1998 |
| WO | WO99/03133 | 1/1999 |

* cited by examiner

*Primary Examiner*—Thi Dang
(74) *Attorney, Agent, or Firm*—Skjerven Morrill MacPherson LLP; David E. Steuber

(57) ABSTRACT

A wafer processing system employing a single-wafer load lock with a cooling unit is disclosed. The small volume of the single-wafer load lock allows for fast pump down and vent cycles. By providing a cooling unit within the load lock, system throughput is further increased by eliminating the need to move a newly processed wafer to a separate cooling station before moving the wafer to the load lock. In another embodiment, the wafer processing system includes a load lock having the capability to both heat and cool a wafer. This further increases throughput in processes where the wafer needs to be pre-heated before putting the wafer in the reactor by eliminating the need for an intermediate pre-heating station.

16 Claims, 7 Drawing Sheets

WAFER PROCESSING ARCHITECTURE INCLUDING LOAD LOCKS

CROSS REFERENCES TO RELATED APPLICATION

This application is a continuation-in-part of U.S. patent application Ser. No. 09/346,258, filed Jun. 30, 1999, which claims priority from U.S. Provisional Application No. 60/092,242 filed Jul. 10, 1998.

BACKGROUND OF THE INVENTION

1. Field of the Invention

The invention generally relates to semiconductor device manufacturing equipment.

2. Description of the Related Art

In the semiconductor industry, special wafer processing systems are used to convert bare semiconductor wafers into working devices. Typically, the wafer processing system has a reactor for processing wafers and a wafer handling system for moving wafers to and from the reactor. The reactor or process module is where wafer processing such as film deposition or etching occurs. The wafer handling system is mechanically coupled to the reactor and has a loading station on which wafers can be loaded from the factory floor. Once loaded onto the loading station, wafers are transferred to and from reactors using mechanical manipulators such as robots.

FIG. 1 shows a wafer processing system in the prior art. Wafer processing system 1 includes a reactor 2 and a wafer handler 3. Wafer handler 3 further includes a user interface 4, a loading station 5, load locks 7A and 7B, and a transfer chamber 6. User interface 4 has a display terminal for entering and reading information and a computer system (not shown) for controlling the operation of wafer processing system 1.

A typical wafer handling sequence for wafer processing system 1 is as follows. Wafer cassette or carrier 10 is moved from loading station 5 into load lock 7A by an indexer robot 28A. Pressure within load lock 7A is decreased using a vacuum pump (not shown). When the desired pressure differential between transfer chamber 6 and load lock 7A is reached, load lock 7A is opened to transfer chamber 6 and a wafer 11 is picked up from wafer carrier 10 and then transferred to reactor 2 by vacuum robot 9. Wafer 11 is then processed inside reactor 2. When processing is completed, wafer 11 is moved from reactor 2 and placed into a cooling station 8 by vacuum robot 9. Cooling of wafer 11 is required because wafer processing temperatures can reach as high as 650° C. whereas wafer carrier 10 typically has a limitation of 70° C., beyond which deformation begins. When cooled, vacuum robot 9 transfers wafer 11 from cooling station 8 and into its original wafer carrier (carrier 10) inside load lock 7A. The other wafers in carrier 10 are processed in a similar manner. After all wafers originally contained in wafer carrier 10 have been processed, load lock 7A is vented to atmospheric pressure, after which cassette 10 is transferred from load lock 7A back to loading station 5.

Load locks 7A and 7B function as transition chambers between transfer chamber 6, which is maintained under vacuum, and loading station 5, which is at atmospheric pressure. Load locks 7A and 7B are referred to as batch load locks because they accommodate multiple wafers, typically in a carrier, at a time. Because load locks 7A and 7B do not have an integral cooling unit, cooling station 8 must be provided within transfer chamber 6. Providing cooling station 8 outside load lock 7A significantly cuts down on the number of wafers that can be processed within a given amount of time because vacuum robot 9 has to move a processed wafer to cooling station 8 before moving the processed wafer into load lock 7A.

In a batch load lock, pump down and vent operations take time because batch load locks must have a volume large enough to accommodate multiple wafers. The long pump down and vent times of the batch load lock adversely affect the wafer processing system's throughput or the number of wafers that the system can process within a given amount of time. This throughput problem is compounded when the system is used with partially filled wafer carriers, as is the case in many factories, specially those involved in custom device fabrication.

The large volume and large internal surface area of batch load locks raise micro-contamination problems. The walls of a load lock adsorb moisture every time the load lock is vented and exposed to atmospheric pressure. This moisture outgasses at operating pressures, creating partial pressure build-up of gases such as, for example, $H_2O$, $N_2$, or $O_2$ in the transfer chamber and the reactor. The larger the load lock, the greater the chance of micro-contaminants entering the transfer chamber and reactor. Further, the load lock must be pumped down to a pressure slightly lower than that of the transfer chamber to prevent micro-contaminants from getting into the transfer chamber. Obtaining this lower pressure takes additional time in a batch load lock because of its large volume.

In order to alleviate the throughput problems associated with batch load locks, some batch load lock systems transfer multiple wafers at a time from the loading station to the load locks. A problem with this approach is that moving multiple wafers at a time increases the chance of wafer handling errors or breakage. Further, all ancillary wafer operations such as wafer alignment, wafer ID reading, and metrology must be performed inside the load lock or transfer chamber under vacuum. This leads to increased complexity and implementation cost.

U.S. Pat. No. 5,512,320 to Turner et. al., incorporated herein by reference, discloses a batch load lock with an integral metallic carrier for cooling processed wafers. In Turner, as in any batch load locks, an elevator is required for incrementally raising each shelf of the metallic carrier to the same level as the vacuum robot or an external atmospheric robot. Because the elevator must be precisely controlled for proper wafer exchange with the vacuum and atmospheric robots, the elevator is essentially a robot which not only complicates but also raises the cost of the wafer processing system. Further, Turner suffers from the same problems associated with batch load locks in the prior art.

Thus, there is a clear need for a wafer processing system that has better throughput, has better contamination control, and is less expensive to implement than those in the prior art.

SUMMARY OF THE INVENTION

The invention provides for a modular wafer processing system. In one embodiment, the modular wafer processing system includes a single-wafer load lock having a cooling unit within. Having a cooling unit within the single-wafer load lock provides for increased system throughput because processed wafers can be directly transferred from the reactor and into the load lock. Throughput is further increased by reducing the volume of the single-wafer load lock to allow for fast pump down and vent times.

In another embodiment of the invention, the modular wafer processing system includes a load lock having the capability to heat and cool a wafer within the load lock. In processes requiring the wafer to be pre-heated before moving the wafer into a reactor, the capability to heat the wafer in the load lock increases throughput because the wafer can be directly moved from the load lock and into the reactor without having to move the wafer into an intermediate pre-heating station. Having a cooling unit within the load lock further increases throughput because processed wafers can be directly transferred from the reactor and into the load lock.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 2:
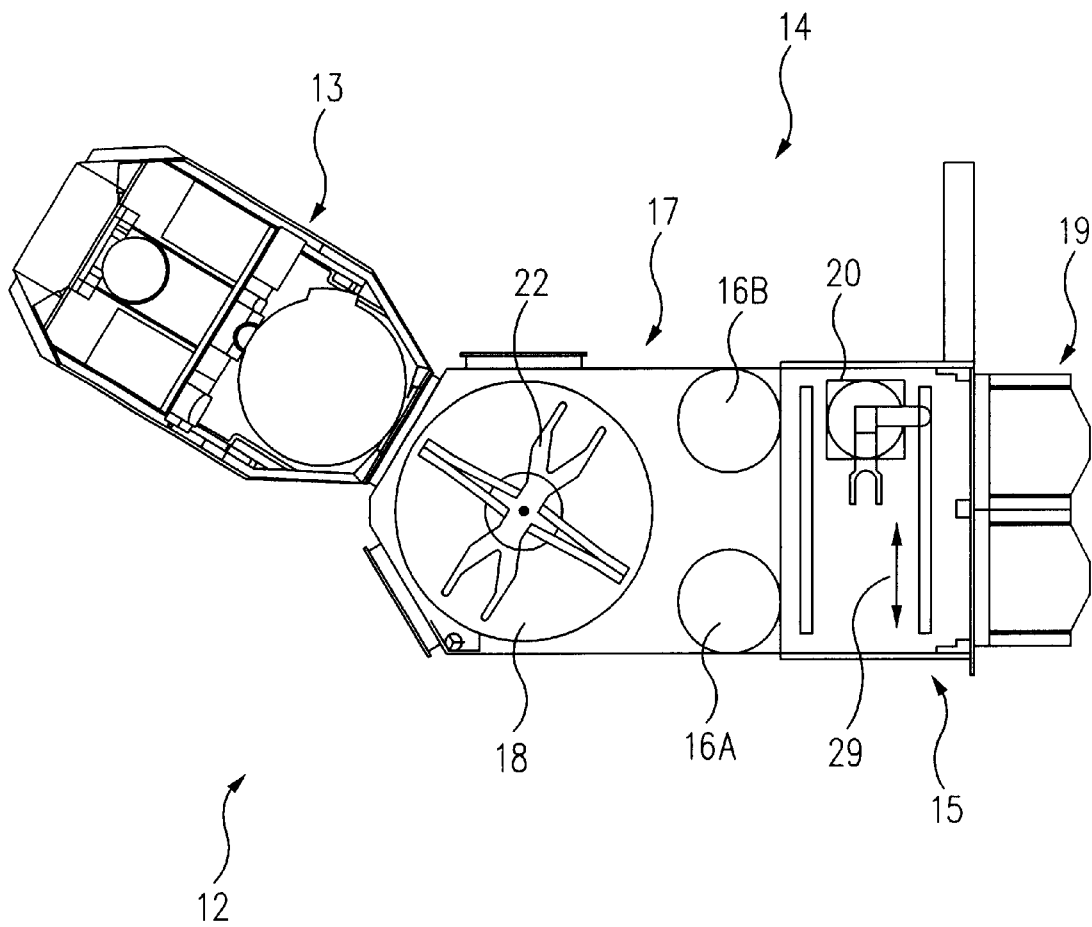
FIG. 2 is a top view of a wafer processing system in accordance with the present invention.

FIG. 2 shows an embodiment of a wafer processing system according to the present invention. Modular wafer processing system 12 comprises a process module or reactor 13 and a wafer transfer system (WTS) 14. An example of modular wafer processing system 12 is the model CONCEPT-3™ wafer processing system manufactured by Novellus Systems, Inc. of San Jose, Calif. Reactor 13 in this particular example is a chemical vapor deposition reactor but could be any semiconductor manufacturing reactor such as those used for etching or physical vapor deposition. Wafer processing system 12 can accommodate a plurality of reactors but only one is shown for clarity of illustration.

Figure 3:
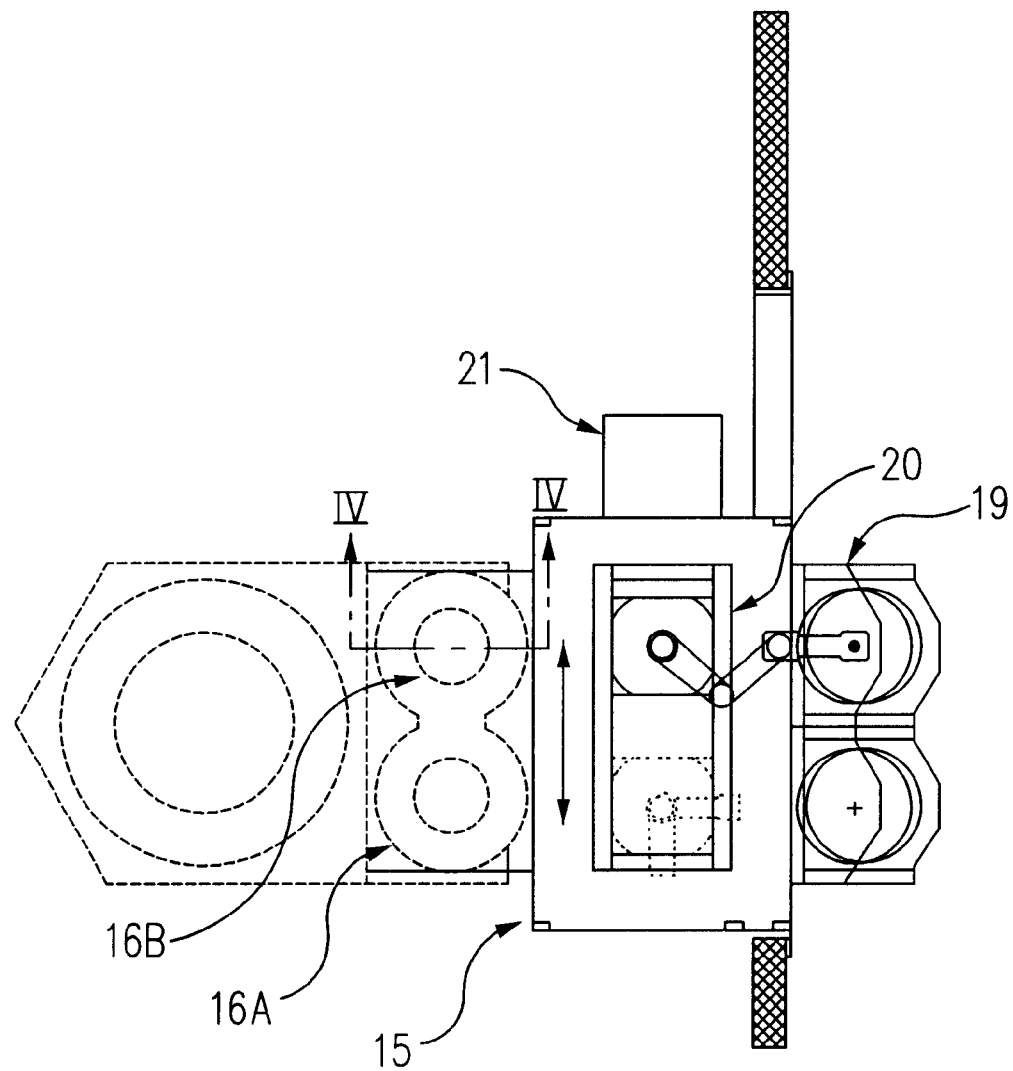
FIG. 3 is a top view showing a location for optional devices which can be used with a wafer processing system in accordance with the present invention.

WTS 14 further includes a front end module 15 and a transfer module 17. Front end module 15 includes a loading station 19 for loading and unloading wafers which are typically in a wafer carrier. Loading station 19 can accommodate commercially available interfaces such as pod loaders or open cassette stages. Front end module 15 also includes an atmospheric robot 20 for moving wafers between loading station 19 and single-wafer load locks 16A and 16B. Atmospheric robot 20 is a conventional 3-axis robot mounted on a fourth translation axis for movement in the direction shown by arrow 29. An example of atmospheric robot 20 is the model 400 Series from Equipe Technologies of Sunnyvale, Calif. The use of other robot configurations is also possible. To minimize wafer handling errors and to simplify wafer ancillary operations, atmospheric robot 20 is designed to pick up one wafer at a time from loading station 19. As shown in FIG. 3, front end module 15 can also be fitted with a wafer aligner and/or protective electrostatic cover (PEC) storage in location 21. The wafer aligner is used for detecting the XY offset of the wafer as well as the wafer notch orientation. The wafer aligner can be any standard wafer aligner unit which is readily available in the semiconductor industry. The PEC consists of one or more horizontally placed shelves located above the wafer aligner.

Figure 4:
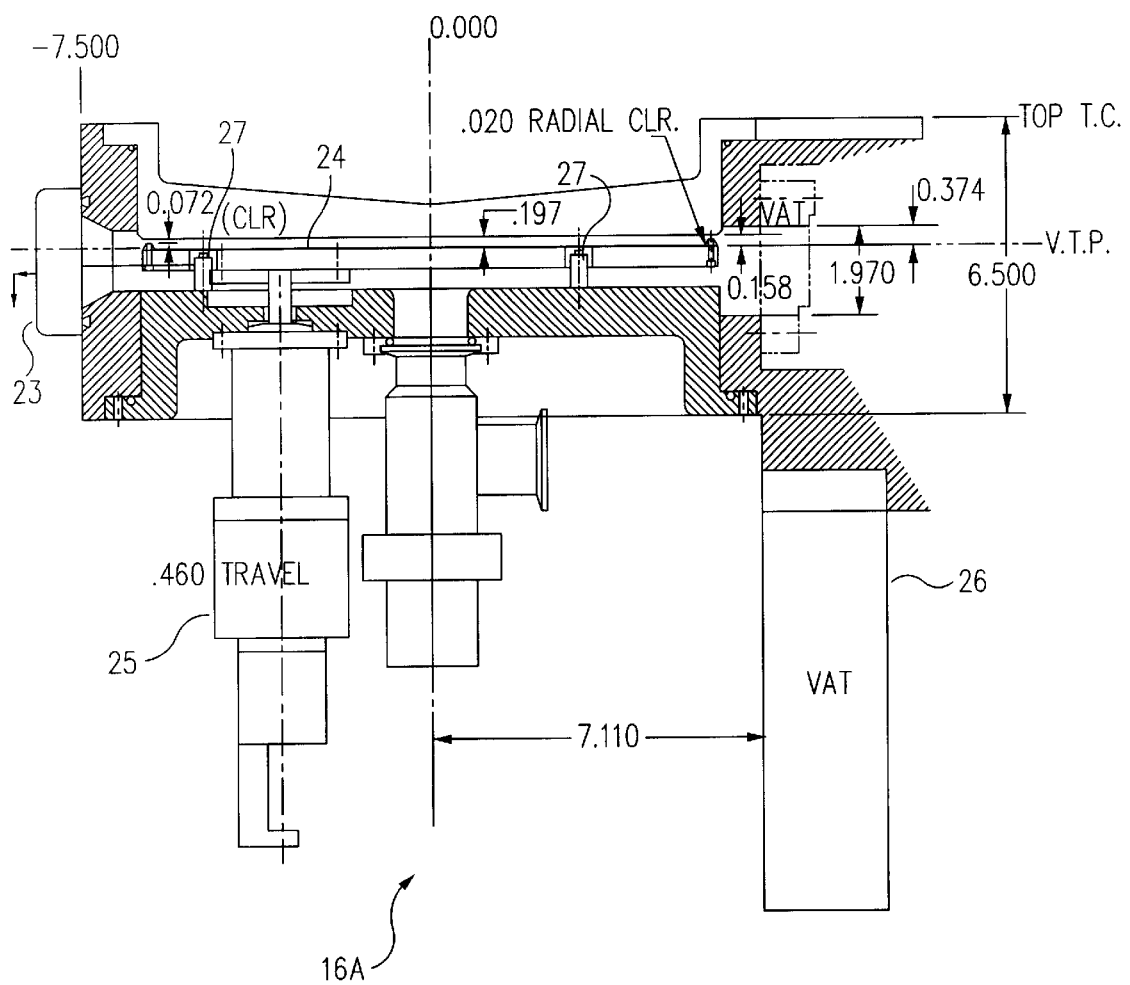
FIG. 4 is a cross-sectional view of a single-wafer load lock in accordance with the present invention.

As shown in FIG. 2, transfer module 17 comprises a transfer chamber 18 and single-wafer load locks (SWLL) 16A and 16B. Transfer chamber 18 includes a vacuum robot 22, a 3-axis polar coordinate robot with two opposing end effectors, for moving wafers between reactor 13 and SWLL 16A and 16B. An example of vacuum robot 22 is the MAGNATRAN™ Model MAG-7 from Brooks Automation, Inc. of Chelmsford, Mass. Any conventional robot may be used without detracting from the merits of the invention. SWLL 16A and 16B are transition chambers between transfer chamber 18, which is maintained under vacuum, and front end module 15, which is at atmospheric pressure. Although the following discussion will be equally applicable to either SWLL 16A or SWLL 16B, only SWLL 16A will be referred to in the interest of clarity. For example, while a description recites moving a wafer to SWLL16A, it is to be understood that the same wafer can be moved to either SWLL16A or SWLL16B, whichever is available. FIG. 4 shows a cross-sectional view of SWLL 16A taken at IV—IV in FIG. 3. Unlike load locks in the prior art, SWLL 16A is a reduced volume load lock and can accommodate only one wafer at a time. SWLL 16A's reduced volume and correspondingly reduced internal surface area allow for better micro-contamination control.

SWLL 16A's small volume provides for maximum system throughput. Because SWLL 16A has a volume of about 5.0 liters, for example, it is capable of pump down and vent times of 10 seconds or less. In contrast, batch load locks typically have a volume greater than 90 liters and can take as long as 3 minutes to pump down or vent. The fast pump down and vent times of SWLL 16A reduce the amount of time a wafer spends in the system (wafer cycle time). Short wafer cycle times provide for high system throughput. Appendix 1 shows load and unload time calculations for various load lock architectures while Appendix 2 shows the corresponding cycle times. Note that although SWLL 16A must be loaded and unloaded 25 times in a 25 wafer run, only the first load and unload cycle affects system throughput. This is because SWLL16A can pump down and vent faster than the vacuum robot can move a wafer from SWLL16A to a reactor and from a reactor to SWLL16A. In other words, vacuum robot 22 does not have to wait for SWLL16A to be available. Thus, a batch load lock's capability to process multiple wafers in a single load and unload cycle does not compensate for the batch load lock's long pump down and vent times.

As shown in FIG. 4, SWLL 16A includes a door 23, a pedestal 24, a pedestal lift 25, a slit valve 26, and a plurality of pins 27. Door 23 faces front end module 15 and allows atmospheric robot 20 to access SWLL 16A while slit valve 26 faces transfer chamber 18 to provide access for vacuum robot 22. Slit valve 26, a widely known component in the semiconductor industry, has a gate which moves in a vertical direction for sealing or opening SWLL 16A. An example of slit valve 26 is the model VAT Series 03 Type-L from VAT, Inc. of Woburn, Mass. To seal SWLL 16A, door 23 is closed and slit valve 26 is placed in the up position.

Figure 1:
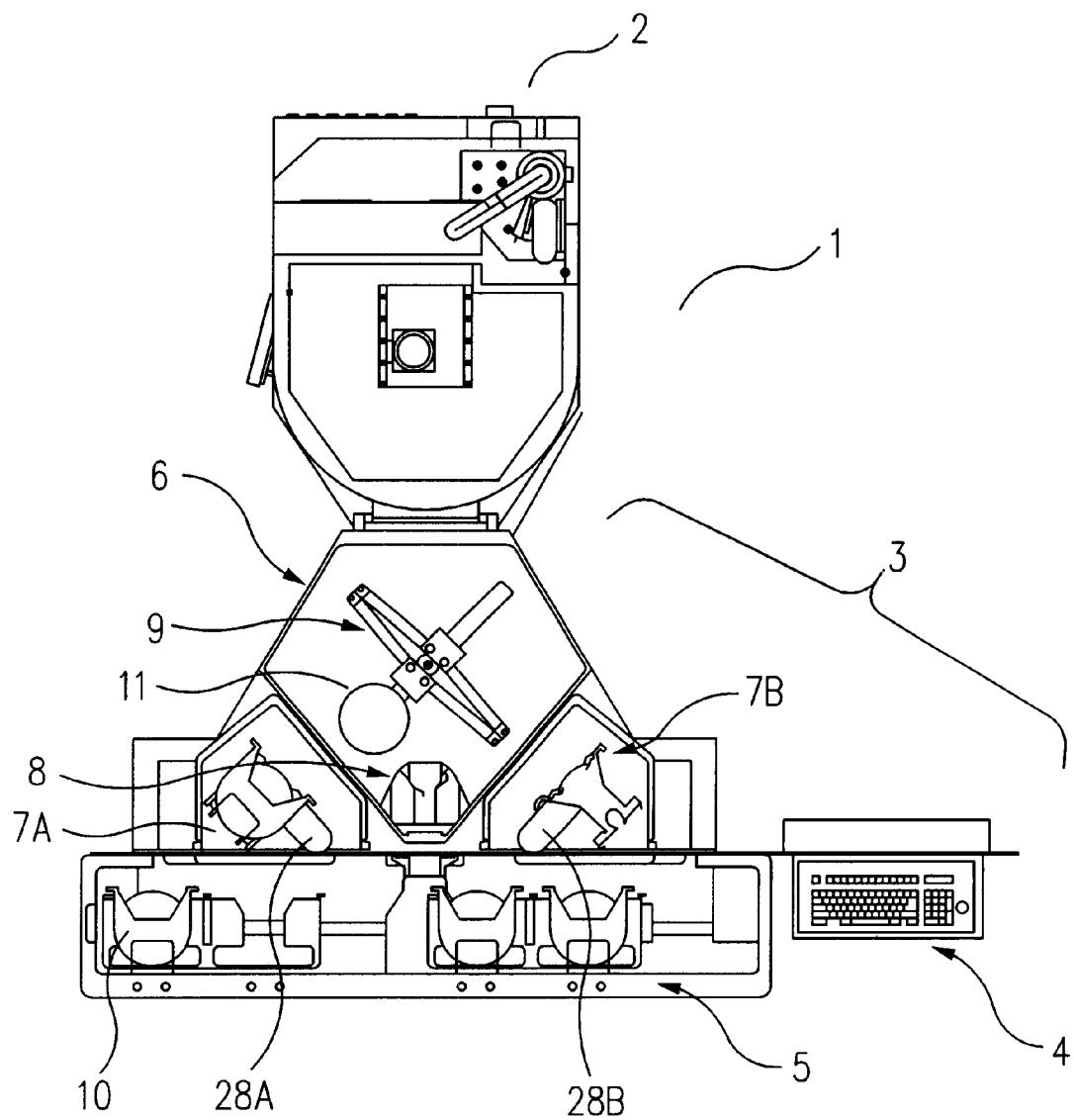
FIG. 1 is a top view of a wafer processing system in the prior art.

Pedestal 24 supports the wafer while SWLL 16A is being pumped down to vacuum or vented to atmospheric pressure. For cooling the wafer, pedestal 24 is water cooled using conventional methods. For example, plumbing can be routed through pedestal lift 25 to supply water to cooling channels within pedestal 24. U.S. Pat. No. 5,512,320 to Turner et. al., incorporated herein by reference, also discloses liquid cooling means. Other cooling methods can also be used without detracting from the merits of the present invention. Because a cooling unit in the form of water cooled pedestal 24 is integrated within SWLL 16A, vacuum robot 22 can move a processed wafer directly to SWLL 16A instead of having to move the processed wafer to a separate cooling station, saving a move step and increasing throughput. In comparing the architectures of WTS 14 and wafer handler 3 (shown in FIG. 1), it is evident that WTS 14 requires the wafer to be moved by vacuum robot 22 only twice (load lock to reactor, reactor to load lock) whereas wafer handler 3 requires the wafer to be moved 3 times (load lock to reactor, reactor to cooling station, cooling station to load lock). Assuming each wafer movement takes 10 seconds, throughput for WTS 14 and wafer handler 3 can be calculated as shown in Table 1. Thus, considering vacuum robot 22 as the limiting component of WTS 14, the present invention can realize an increased throughput of 60 wafers per hour (180 wph–120 wph), or a 50% increase over wafer handler 3.

TABLE 1

|  | Number of Moves | Door to Door Time (sec) | Throughout (wph) |
|---|---|---|---|
| WTS 14 | 2 | 20 | 180 |
| Wafer Handler 3 | 3 | 30 | 120 |

Pedestal lift 25 provides vertical travel for pedestal 24 to allow the wafer to be lifted from or placed on pins 27 during wafer exchange. Unlike the elevators or indexer robots used in batch load locks, pedestal lift 25 only has an up and a down position. Those skilled in the art will appreciate that a two position lift does not need precise control and can be actuated using, for example, low-cost conventional pneumatic methods. Further, pins 27 define a fixed wafer pick-up or placement point for both vacuum robot 22 and atmospheric robot 20, simplifying robot alignment requirements in the system.

Wafer transfer and processing according to the teachings of the present invention are now described. A wafer carrier containing pre-processed wafers is loaded onto loading station 19 shown in FIG. 2. Ancillary wafer operations, such as wafer mapping, are performed on the pre-processed wafers. Atmospheric robot 20 then picks up a single pre-processed wafer from loading station 19 and places the pre-processed wafer through door 23 onto pins 27 within SWLL 16A or SWLL 16B, whichever is available. If an optional wafer aligner, wafer ID reader, or metrology unit is installed, the pre-processed wafer is moved to said optional units in location 21 shown in FIG. 3 before the pre-processed wafer is placed on pins 27 inside SWLL 16A (or SWLL 16B). SWLL 16A is sealed (i.e. door 23 and slit valve 26 are closed) and, simultaneously, pedestal 24 is lifted to raise the pre-processed wafer from pins 27. SWLL 16A is then pumped down. When the desired pressure differential between transfer chamber 18 and SWLL 16A is reached, slit valve 26 is opened (i.e. placed in the down position) while, simultaneously, pedestal 24 is lowered to rest the pre-processed wafer on pins 27. Vacuum robot 22 picks up the pre-processed wafer from pins 27 and moves the pre-processed wafer into reactor 13 for processing. Subsequently, vacuum robot 22 picks up a processed wafer from reactor 13 and places the processed wafer on pins 27 within SWLL 16A or 16B, whichever is available. Once the processed wafer is inside SWLL 16A (or SWLL 16B), slit valve 26 is closed (i.e. placed in the up position) and pedestal 24 is lifted to raise the processed wafer from pins 27. While SWLL 16A is vented to atmospheric pressure, pedestal 24 cools the processed wafer to a temperature below 70° C. When SWLL 16A reaches atmospheric pressure, door 23 opens and pedestal 24 is lowered to rest the processed wafer on pins 27. Atmospheric robot 20 picks up the processed wafer from pins 27 for movement to loading station 19, completing the wafer processing cycle. During vent operations and during wafer exchange with atmospheric robot 20, it is desirable to purge SWLL 16A with an inert gas, such as nitrogen, argon, or helium, to prevent moisture from adsorbing onto the surfaces of the load lock.

Figure 5:
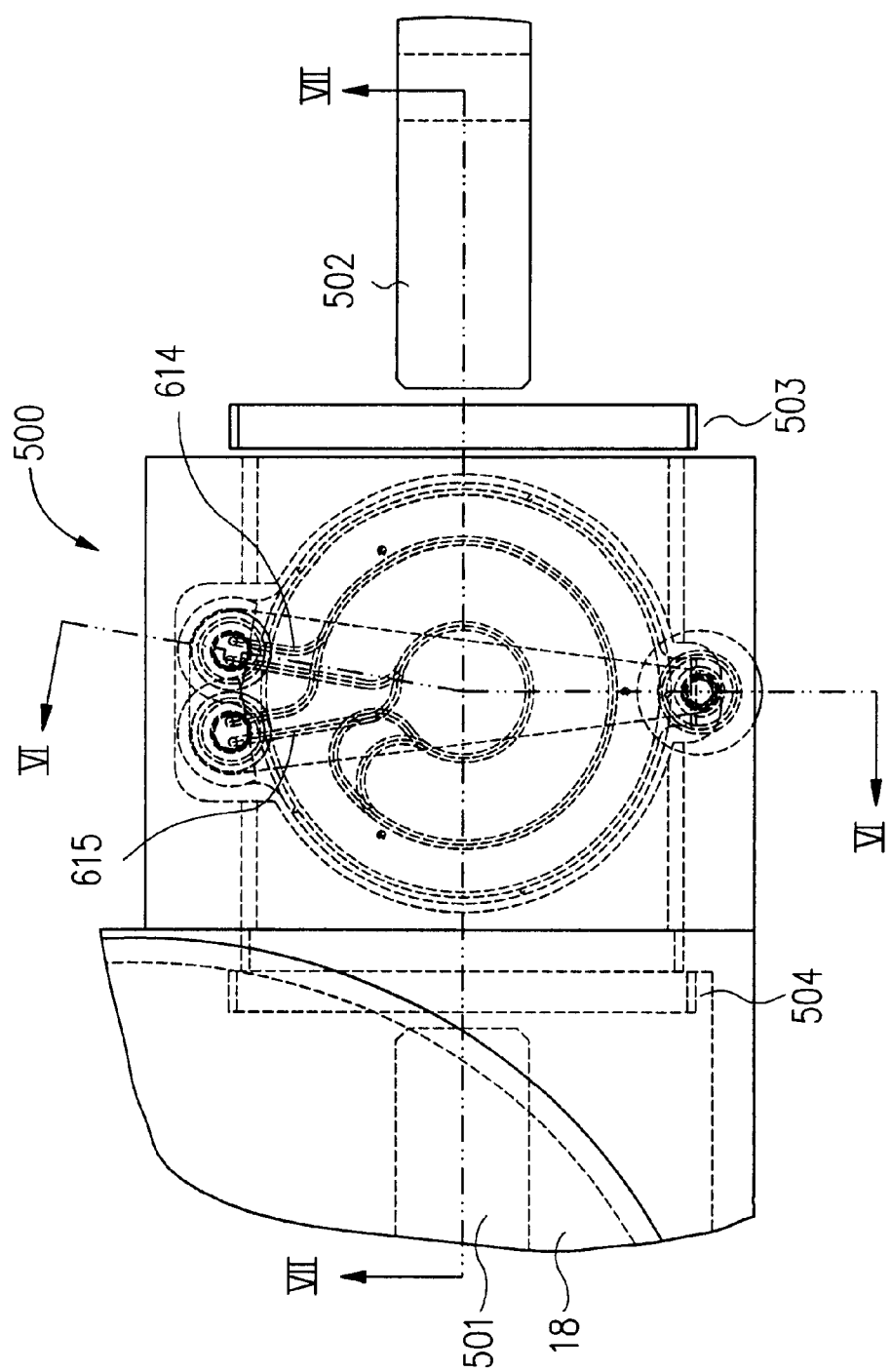
FIG. 5 shows a top view of a load lock in accordance with the present invention.
Figure 6:
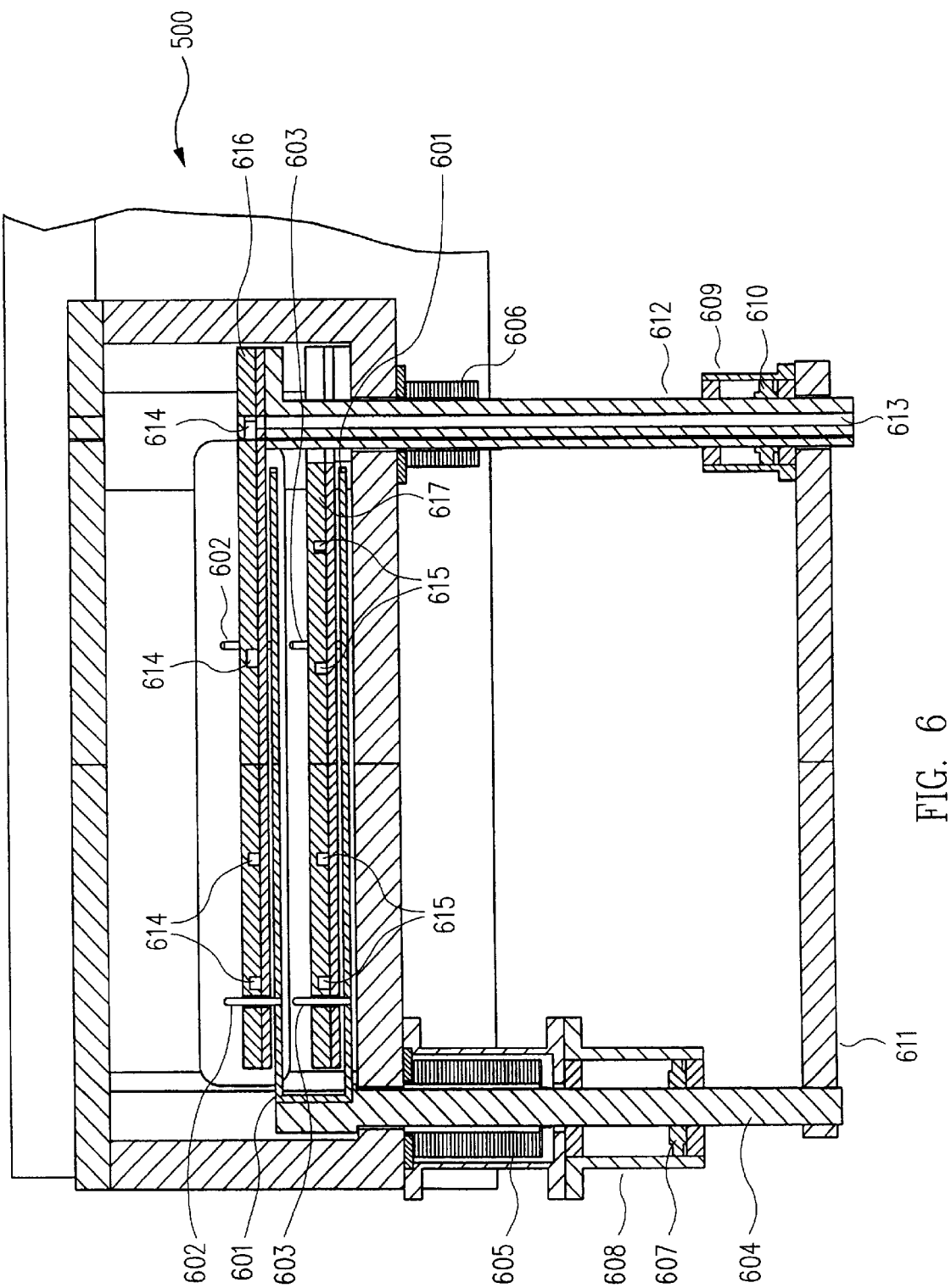
FIG. 6 shows a cross-sectional view of the load lock shown in FIG. 5.
Figure 7:
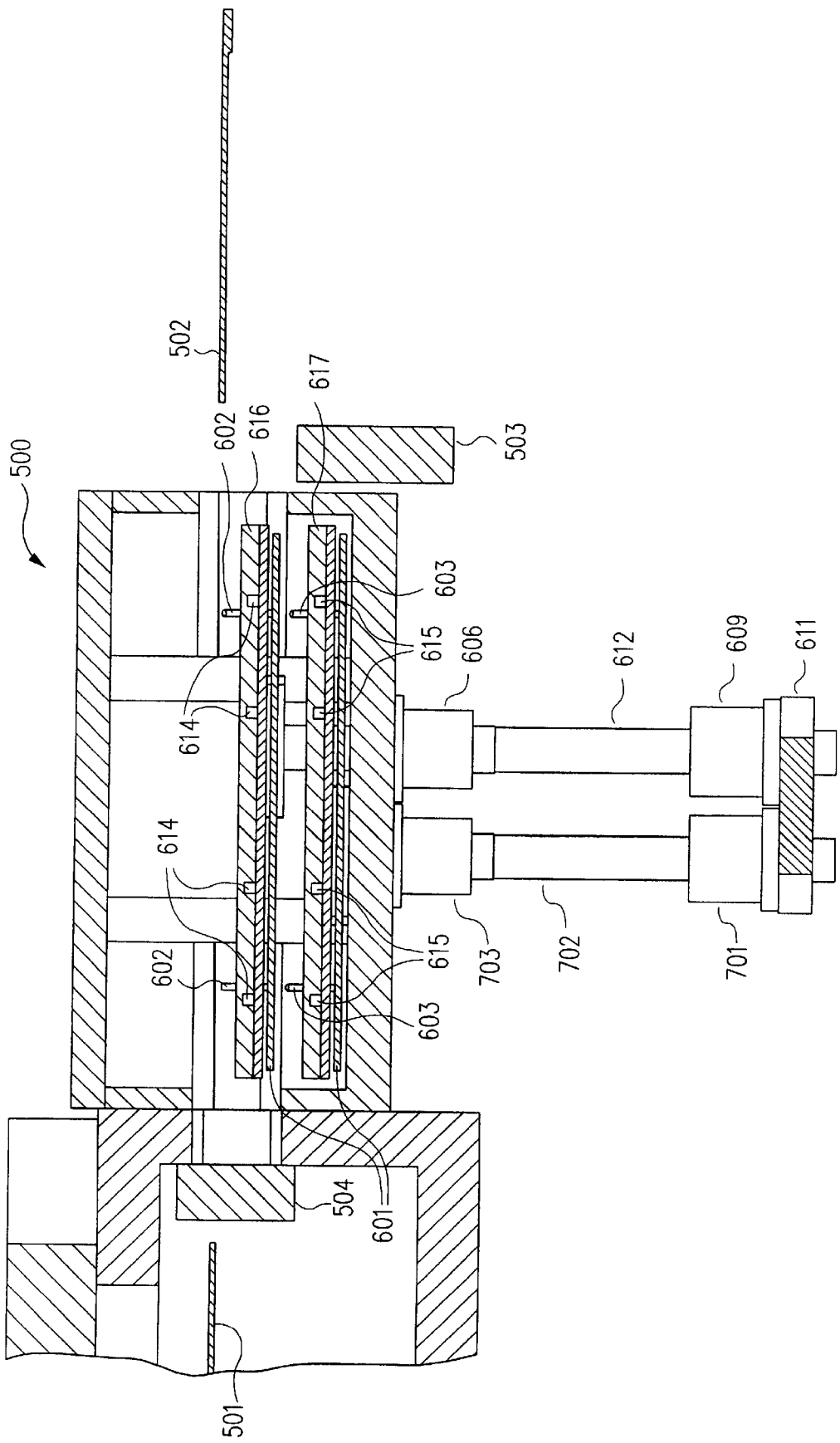
FIG. 7 shows another cross-sectional view of the load lock shown in FIG. 5.

In another embodiment of the invention, a load lock 500, which is shown in FIG. 5, is used in wafer processing system 12 instead of SWLL 16A (or SWLL 16B). FIG. 5 shows a top view of load lock 500 and end-effectors 501 and 502, which are attached to vacuum robot 22 and atmospheric robot 20, respectively. Referring to FIG. 6, which shows a cross-sectional view of load lock 500 taken along section VI—VI in FIG. 5, load lock 500 has an upper level, which includes an upper pedestal 616 for heating a pre-processed wafer, and a lower level, which includes a lower pedestal 617 for cooling a processed wafer. Pedestals 616 and 617, and thus the heating and cooling functions, may be implemented in either level of load lock 500. The upper level has upper pins 602 for supporting a pre-processed wafer thereon during wafer exchange. Once the pre-processed wafer is on upper pins 602, load lock 500 is sealed (i.e. doors 503 and 504 shown in FIGS. 5 and 7 are closed) and upper pedestal 616 lifts the pre-processed wafer from pins 602. The pre-processed wafer is heated while load lock 500 is pumped down to vacuum pressure. Subsequently, door 504 opens, pedestal 616 lowers the pre-processed wafer onto upper pins 602, and robot 22 moves the pre-processed wafer to a reactor. Both the upper and lower levels of load lock 500 are raised such that the lower level lines up with the opening of door 504. Robot 22 then moves a processed wafer from the reactor and onto lower pins 603. Once door 504 closes, pedestal 617 lifts the processed wafer from lower pins 603. The processed wafer is cooled while load lock 500 is vented to atmospheric pressure. Thereafter, door 503 opens, pedestal 617 lowers the processed wafer onto lower pins 603, and the processed wafer is picked-up by atmospheric robot 20. The upper and lower levels of load lock 500 are then lowered such that the upper level lines up with the opening of door 503. Atmospheric robot 20 places another pre-processed wafer onto upper pins 602 to repeat the processing cycle.

Upper pedestal 616 is attached to a shaft 612 which is coupled to a piston 610. When air is pumped into an air cylinder 609, piston 610 is pushed upwards thereby lifting upper pedestal 616 via shaft 612. As shown in FIGS. 5 and 6, upper pedestal 616 has an embedded channel 614, which is coupled to channel 613 of shaft 612, to accommodate resistive heating elements (not shown) or heating liquid for heating the pre-processed wafer. The pre-processed wafer may also be heated using other heating methods such as by using irradiative heating elements (e.g. lamps).

Load lock 500's lower level is configured similarly to its upper level. Referring to FIG. 7, which shows a cross-sectional view of load lock 500 taken along section VII—VII in FIG. 5, a lower pedestal 617 lifts a processed wafer from lower pins 603 when air is pumped into an air cylinder 701 thereby driving upwards a shaft 702 which is attached to lower pedestal 617. Lower pedestal 617 has a channel 615 through which a cooling liquid is flown to cool the processed wafer while load lock 500 is vented to atmospheric pressure. Channel 615 is coupled to a channel (not shown) within shaft 702.

As shown in FIG. 6, upper pins 602 and lower pins 603 are supported by a pin support 601. Pin support 601 is attached to a shaft 604 which is coupled to a piston 607 of an air cylinder 608. When air is pumped into cylinder 608, piston 607 pushes shaft 604 upwards, thereby lifting pin support 601, upper pins 602, and lower pins 603. Shaft 604 is also attached to a mounting frame 611 which, in turn, supports air cylinder 609 and air cylinder 701 (FIG. 7). Thus, pumping air into cylinder 608 not only lifts pins 602 and 603, but pedestals 616 and 617 (via shafts 612 and 702) as well. This allows either level of load lock 500 to line up with the openings of doors 503 and 504 and provide robot access during wafer exchange. Bellows 605, 606, and 703 are employed to vacuum seal the openings used by shafts 604, 612, and 702, respectively. Doors 503 and 504 (FIGS. 5 and 7) may be any conventional hinged door, sliding door, slit valve, or gate valve.

Dimples (not shown) which are approximately 0.0012 inch in height may be added to the surface of pedestals 616 and 617 of load lock 500 and pedestal 24 of SWLL 16A (or SWLL 16B). Such dimples can be made, for example, by embedding items such as balls (e.g. sapphire balls) or pins into a pedestal's surface. Dimples can also be made by machining the pedestal. By providing dimples on the pedestal surface, the entire wafer does not directly contact the pedestal. The resulting gap between the wafer and the pedestal allows for uniform heat or cooling transfer thereby preventing wafer warpage due to temperature gradients. The use of dimples on a pedestal surface including other techniques which may be applicable to pedestals in general is also described in commonly-owned U.S. Provisional Application No. 60/154,438, filed Sep. 17, 1999, entitled "Apparatus and Method For Semiconductor Wafer Cooling, Heating, and Backside Particle Control," which is incorporated herein by reference in its entirety.

In processes requiring the wafer to be pre-heated before moving the wafer into a reactor, the capability to heat the wafer within load lock 500 increases system throughput because the wafer can be directly moved from load lock 500 and into the reactor without having to move the wafer to an intermediate pre-heating station or to spend additional time pre-heating the wafer in the reactor. Having a cooling unit within load lock 500 also increases throughput because the wafer can be directly transferred from the reactor and into load lock 500, eliminating the need to move the wafer to an intermediate cooling station. Of course, the cooling unit and heatings unit of load lock 500 are not limited to any specific application and may be used for both incoming (to be processed) and outgoing (processed) wafers. Further, load lock 500 may be built such that one level is passive (i.e. does not have a heating unit or a cooling unit) while another level has a heating unit or a cooling unit. Load lock 500 may also have more than two levels.

The above detailed description is provided to illustrate the specific embodiments of the present invention and is not intended to be limiting. It is to be understood that numerous variations and modifications within the scope of the present invention are possible. For example, robots, cooling methods, and heating methods which are different from that disclosed herein can be used without detracting from the merits of the present invention. Further, the invention can be used for moving wafers in a variety of semiconductor manufacturing applications. The invention is set forth in the following claims.

APPENDIX 1

| Load Step | WTS | Batch Load lock | Batch Load lock with Cool |
|---|---|---|---|
| Load Pod or Cassette | 5 | 10 | 5 |
| Map Wafers | 20 | 0 | 20 |
| Get Wafer From Cassette | 2 | | 2 |
| Translate Atmospheric Robot to Load Lock | 2 | | 2 |
| Put Wafer Into Load Lock | 2 | | 2 |
| Close Load Lock door | 2 | 2 | 2 |
| Pump Down Load Lock | 10 | 180 | 180 |
| Open Load Lock Slit Valve | 1 | 1 | 1 |
| Vacuum Robot Gets Wafer From Load Lock | 4 | 4 | 4 |
| Vacuum Robot Rotates To Process Module | 2 | 2 | 2 |
| Vacuum Robot Puts Wafer Into Process Module | 4 | 4 | 4 |
| Load Time Total | 54.0 | 203.0 | 224.0 |

| Unload Step | WTS | Batch Load lock | Batch Load lock with Cool |
|---|---|---|---|
| Vacuum Robot Rotates To Process Module | 2 | 2 | 2 |
| Vacuum Robot Gets Wafer from Process Module | 4 | 4 | 4 |
| Vacuum Robot Rotates to Cooling Station | | 2 | |
| Vacuun Robot Puts Wafer to Cooling Station | | 4 | |
| Cool Time | | 30 | |
| Vacuum Robot Gets Wafer from Cooling Station | | 4 | |
| Vacuum Robot Rotates to Load Lock | 2 | 2 | 2 |
| Vacuum Robot Puts Wafer into Load lock | 4 | 4 | 4 |
| Close Load Lock Slit Valve | 1 | 1 | 1 |
| Vent Load Lock | 10 | 120 | 120 |
| Open Load Lock door | 2 | 2 | 2 |
| Get Wafer from Load Lock | 2 | 0 | 2 |
| Translate Atmospheric Robot to Load Lock | 3 | 0 | 3 |
| Put Wafer Into Cassette | 2 | 0 | 2 |
| Unload Pod or Cassette | 5 | 10 | 5 |
| Unload Time Total | 37.0 | 185.0 | 147.0 |

| Process Module Exchange | Time |
|---|---|
| Vacuum Robot Rotates to Process Module | 2 |
| Put Wafer Into Process Module | 4 |
| Vacuum Robot Rotates 180° | 3 |
| Vacuum Robot Gets Wafer From Process Module | 4 |
| Process Module Exchange Time Total | 13.0 |

Note:
Times are approximations based on actual system performance.

APPENDIX 2

Wafer Cycle Time Summary

| | Load (sec) | Unload (sec) | Process Module Exchange (sec) | Total (min) |
| --- | --- | --- | --- | --- |
| WTS | 54.0 | 37.0 | 13.0 | 1.7 |
| Batch Load lock | 203.0 | 185.0 | 13.0 | 6.7 |
| Batch Load lock with Cool | 224.0 | 147.0 | 13.0 | 6.4 |

Assumptions
(1) Times indicated are for one wafer to cycle through system with no WIP in the tool.
(2) Process time in process module is zero. Actual wafer cycle time would include time wafer is in process module plus the above overhead.
(3) Robot and slit valve times are constant for all applications.
(4) Cool time for batch load lock is assumed to be 30 seconds.
(5) Batch load lock vent/pump times are for a 200 mm system. Actual 300 mm load lock pump/vent times would be longer.

What is claimed is:

1. A load lock for a semiconductor wafer processing system comprising:
   a load lock chamber having first and second openings and first and second doors for opening and closing said first and second openings, respectively;
   an upper level including an upper pedestal;
   a lower level including a lower pedestal;
   a heating unit for heating a wafer on one of said pedestals and a cooling unit for cooling a wafer on the other of said pedestals; and
   a pump for reducing the pressure in said load lock.

2. The load lock of claim 1 wherein said upper pedestal contains said heating unit and said lower pedestal contains said cooling unit.

3. The load lock of claim 1 wherein said upper and lower levels are movable together between a high position and a low position, said upper level being lined up with said openings when said upper and lower levels are in said low position, said lower level being lined up with said openings when said upper and lower levels are in said high position.

4. The load lock of claim 3 wherein said upper level includes a plurality of upper pins, said upper pedestal and said upper pins being movable vertically with respect to each other so as to lift a wafer from said upper pins or to lower a wafer onto said upper pins; and wherein said lower level includes a lower pedestal and a plurality of lower pins, said lower pedestal and said lower pins being movable vertically with respect to each other so as to lift a wafer from said lower pins or to lower a wafer onto said lower pins.

5. The load lock of claim 4 comprising:
   a first actuator for lifting and lowering said upper pedestal with respect to said upper pins;
   a second actuator for lifting and lowering said lower pedestal with respect to said lower pins;
   a pin support, said upper and lower pins being mechanically coupled to said pin support; and
   a third actuator mechanically coupled to said pin support and said first and second actuators.

6. The load lock of claim 5 wherein each of said first, second and third actuators comprises a gas-actuated piston and cylinder.

7. The load lock of claim 6 comprising a first shaft connecting said first actuator and said upper pedestal and a second shaft connecting said second actuator and said lower pedestal.

8. The load lock of claim 7 comprising a third shaft connecting said third actuator and said pin support, said third shaft being mechanically coupled to said first and second actuators.

9. The load lock of claim 1 wherein said heating unit comprises a resistive heating element.

10. The load lock of claim 1 wherein said heating unit comprises a channel for flowing a heated liquid.

11. The load lock of claim 1 wherein said heating unit comprises an irradiative heating element.

12. The load lock of claim 1 wherein said cooling unit comprises a channel for flowing a cooled liquid.

13. A system for processing a semiconductor wafer comprising:
   a loading station;
   a load lock according to claim 1;
   a first robot for moving the wafer between said loading station and said load lock;
   a reactor;
   a transfer chamber in communication with said reactor and said load lock; and
   a second robot for moving the wafer between said load lock and said reactor.

14. A method for processing a semiconductor wafer using a loading station, a reactor, and a load lock, the load comprising an upper level including an upper pedestal, a lower level including a lower pedestal, a heating unit for heating a wafer on said upper pedestal, and a cooling unit for cooling a wafer on said lower pedestal; said method comprising:
   moving said wafer from said loading station to said upper pedestal;
   heating said wafer using said heating unit;
   moving said wafer from said upper pedestal to said reactor;
   processing said wafer within said reactor;
   moving said wafer from said reactor to said lower pedestal;
   cooling said wafer using said cooling unit; and
   moving said wafer from said lower pedestal to said loading station.

15. The method of claim 14 wherein said upper level comprises a plurality of upper pins and said lower level comprises a plurality of lower pins, said method comprising:
   moving said wafer from said loading station to said upper pedestal comprises moving said wafer from said loading station to a position at rest on said upper pins and lifting said upper pedestal to support said wafer;
   moving said wafer from said upper pedestal to said reactor comprises lowering said upper pedestal so that said wafer rests on said upper pins;
   moving the wafer from said reactor to said lower pedestal comprises moving the wafer from said reactor to a position at rest on said lower pins and lifting said lower pedestal to support said wafer; and
   moving the wafer from said lower pedestal to the loading station comprises lowering said lower pedestal so that said wafer rests on said lower pins.

16. The method of claim 15 wherein said upper and lower pins are supported by a pin support, said method comprising, after moving said wafer from said upper pedestal to said reactor, moving said pin support between a low position and a high position.

* * * * *